United States Patent
Faull

(10) Patent No.: US 6,677,772 B1
(45) Date of Patent: Jan. 13, 2004

(54) CONTACTOR WITH ISOLATED SPRING TIPS

(75) Inventor: James A. Faull, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,066

(22) Filed: Aug. 21, 2002

(51) Int. Cl.⁷ .............................................. G01R 31/02
(52) U.S. Cl. ...................................................... 324/761
(58) Field of Search ................................. 324/761, 754, 324/765, 158.1, 758, 72.5, 757; 439/482, 700, 824, 877

(56) References Cited

U.S. PATENT DOCUMENTS

| | | |
|---|---|---|
| 4,918,384 A | 4/1990 | Giringer et al. |
| 5,227,718 A | 7/1993 | Stowers et al. |
| 5,420,519 A | 5/1995 | Stowers et al. |
| 5,451,883 A | 9/1995 | Staab |
| 5,576,631 A | 11/1996 | Stowers et al. |
| 5,688,127 A | 11/1997 | Staab et al. |
| 5,703,494 A * | 12/1997 | Sano ........................... 324/761 |
| 5,781,023 A | 7/1998 | Swart et al. |
| 5,936,421 A | 8/1999 | Stowers et al. |
| 6,034,532 A | 3/2000 | Tarzwell |
| 6,222,377 B1 | 4/2001 | Kato |
| 6,225,817 B1 | 5/2001 | Sayre et al. |

* cited by examiner

Primary Examiner—Kamand Cuneo
Assistant Examiner—Jimmy Nguyen
(74) Attorney, Agent, or Firm—TraskBritt

(57) ABSTRACT

The spring-loaded contact probe electrically connects a semiconductor device, such as a device under test (DUT) with a substrate, such as a DUT board to be coupled with testing equipment. The probe comprises a barrel, two probes slidable within the barrel, and two isolated springs for loading the probes. The two isolated springs allow the probes to be engaged without affecting the connection of the opposite probe. The barrel housing the probes is securely attached within a socket. An array of these sockets may be used as a connector device between the DUT and DUT board.

21 Claims, 4 Drawing Sheets

CONTACTOR WITH ISOLATED SPRING TIPS

BACKGROUND OF THE INVENTION

1. Field of the Invention

The invention relates to a spring-loaded contact probe used to provide electrical contact between electrical components, such as between testing equipment and an electrical device under test (DUT) or between any two electrical components of an assembly.

2. State of the Art

Electronic devices such as circuit boards and integrated circuit devices are tested after they are manufactured to verify that all required electrical connections have been properly completed and that all electrical components are performing properly. The DUT is coupled to a DUT board using a contactor. The DUT board is coupled to a testing machine. Spring-loaded contact probes are often used in the contactor to provide electrical contact when sending or receiving test signals from the DUT board. The spring-loaded probes, also known as pogo pins, are housed in sockets and formed in an array to simultaneously provide contact between the DUT and the DUT board. The array of pogo pins is aligned with the targeted test contacts of the DUT. The pogo pins are formed of conductive material to provide an electrical connection between the DUT and DUT board.

A pogo pin typically includes a barrel type housing having an axially movable probe therein, the probe having a pin-shaped end on one or both ends thereof. Pogo pins are typically mounted in an array in a substrate and may be removed to allow replacement of the probe. Typically, one end of the movable probe extends in one direction of the contact pads of a device under test while the opposite end of the probe extends toward the contact pads of a substrate. Within the barrel type housing, the probe may resiliently slide axially within the housing having at least one spring biasing the probe within the housing. The spring acts to resiliently bias the probe for maintaining the tips in contact with a device under test and a portion of the substrate. Typically, during testing, one end of the probe is retained by engaging a contact pad or ferrule in an aperture in the substrate, compressing the spring resiliently biasing the probe within the barrel type housing, while a device under test is pulled or moved down to engage the other end of the probe through the use of any of several known apparatus using either vacuum, pneumatic or mechanical actuation or any combination thereof, to further resiliently bias the probe within the barrel type housing and increasing the amount of force acting upon the substrate.

A problem with the conventional pogo pin is the damage to the contact pads or ferrules of the substrate from the repeated contacting of the lower tip of the probe and portions of the substrate. The cyclical motion of the repeated contacts causes fretting, a form of contact degradation. Fretting of a contact may cause oxidation products or wear debris in the interface, or frictional polymer formation. This creates shorting problems, reducing the reliability connection. The contact pads then must be repaired or replaced due to the damage.

Accordingly, there is a need for a pogo pin which reduces fretting and improves the reliability of the contacts and, therefore, the reliability of the connection during use of the pin. A pogo pin which isolates the connection between the lower end thereof and the contact pad on a substrate from cyclical forces is desired.

BRIEF SUMMARY OF THE INVENTION

An improved double-headed test probe provides for isolating the contacts of a substrate from the forces caused by contacting the upper tip to each semiconductor device. Springs controlling the movement of each tip are isolated from one another by means of a feature attached to the barrel of the test probe. This isolated spring design may also be used when retrofitting existing sockets or contactors.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
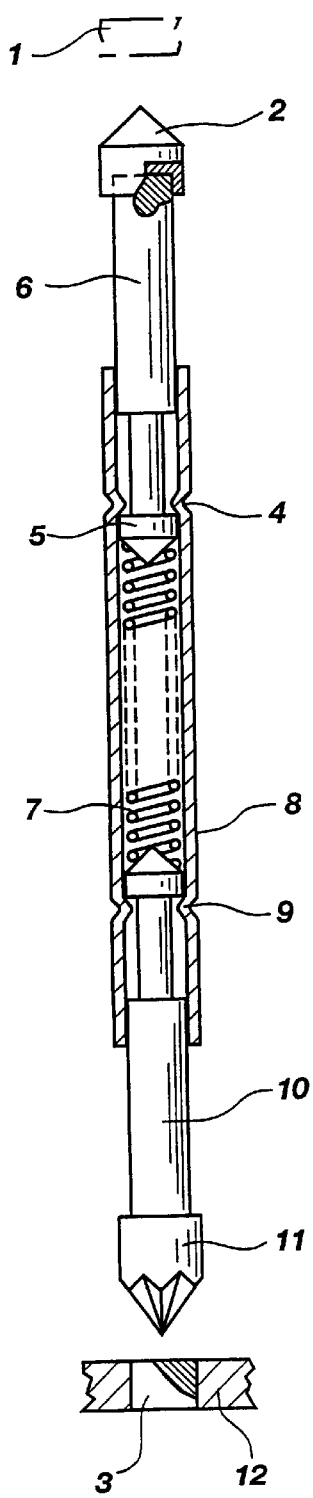
FIG. 1 shows a cross-sectional view of the prior art.

Illustrated in drawing FIG. 1 is a double-headed pogo pin having one spring 7 connecting the two tips 2, 11 of the pogo pin. This pogo pin is commercially available from Emulation Technology, Inc. and is sold under the trade name "Ultra-Mini Pogo Pin." The barrel 8 of the pogo pin is made from a single piece of circular cylindrical tube. Collars 4, 9 are spaced axially from the upper and lower ends of the barrel 8. The collars form stops, bounding the axial motion of the probes 6, 10. The resting position of the probes with no pressure applied to upper tip 2 or lower tip 11 is illustrated in drawing FIG. 1. Spring 7 forces probes 6, 10 outward against collars 4, 9. When the pogo pin is engaged, lower tip 11 will push against a contact pad 3 of DUT board 12.

Figure 2:
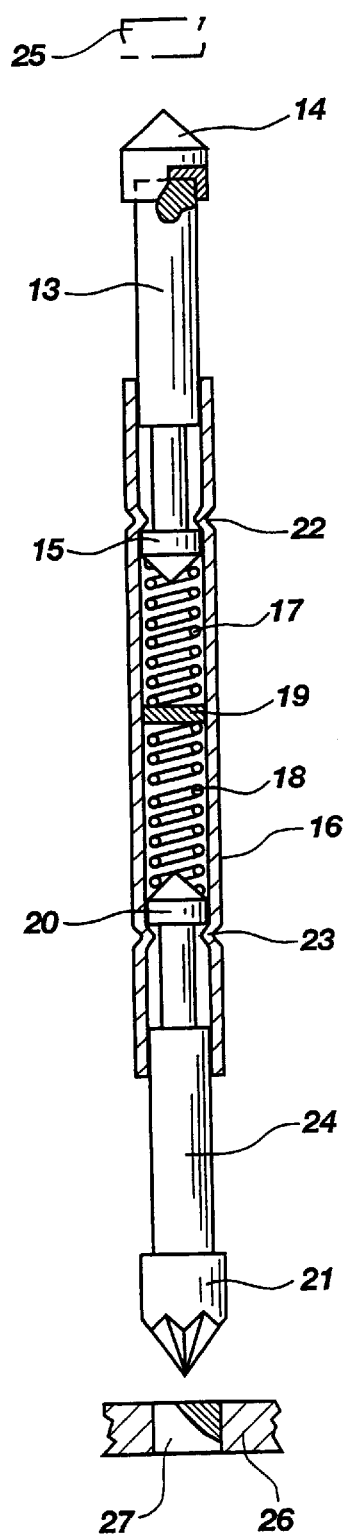
FIG. 2 is a cross-sectional view of one embodiment of the present invention with tips non-engaged, in the resting position.

The present invention depicted in drawing FIG. 2 is a test probe including two tips 14, 21, springs 17, 18, and barrel 16 with a feature 19 isolating the springs. All parts of the test probe are made of a good electrical conductor (e.g., metal such as copper, brass, or nickel) and/or may be coated with a conductive layer (e.g., gold). The test probe is illustrated in the resting position, and the springs 17, 18 force larger diameter portions 15, 20 of the probes 13, 24 against the upper and lower stops 22, 23, either discreet indentations in the barrel 16 or an annular groove in the barrel 16, or an annular collar attached to the interior of the barrel 16, located axially from the openings in the barrel 16. The larger diameter portions 15, 20 of the probes 13, 24, may include a collar attached to the shaft portion of the probe 13, 24. The probes 13, 24 may have the larger diameter portions 15, 20 thereof, respectively, formed as a collar on the body of the probe 13, 24.

Figure 3:
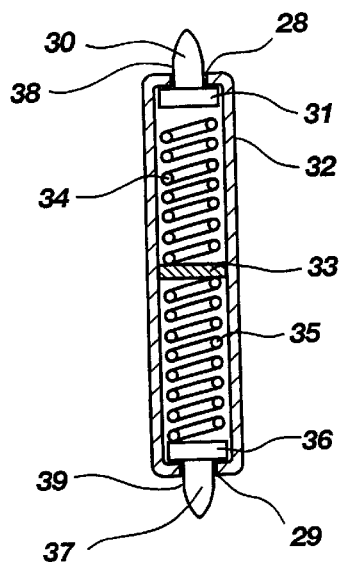
FIG. 3 is a cross-sectional view of a second embodiment of the present invention with tips non-engaged, in the resting position.

Depicted in drawing FIG. 3 is another embodiment of the invention where the openings 28, 29 of the barrel 32 are reduced to restrict the axial motion of the probes.

Figure 4:
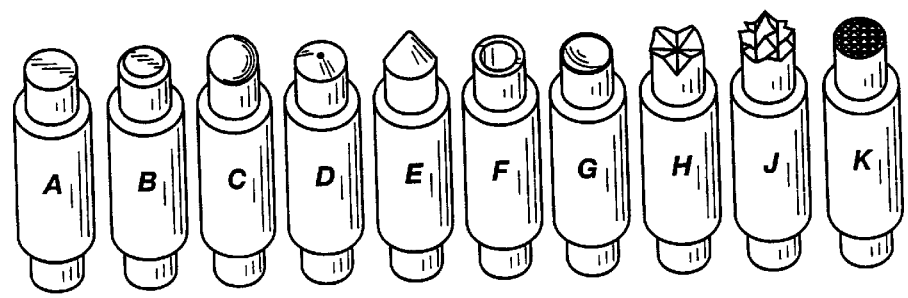
FIG. 4 is a view of several available tip shapes.

Tips 30, 37 may be made shaped as any of several known point styles, such as examples A-K illustrated in drawing FIG. 4. The tips must be highly conductive and may be formed nickel plated with gold.

Figure 5:
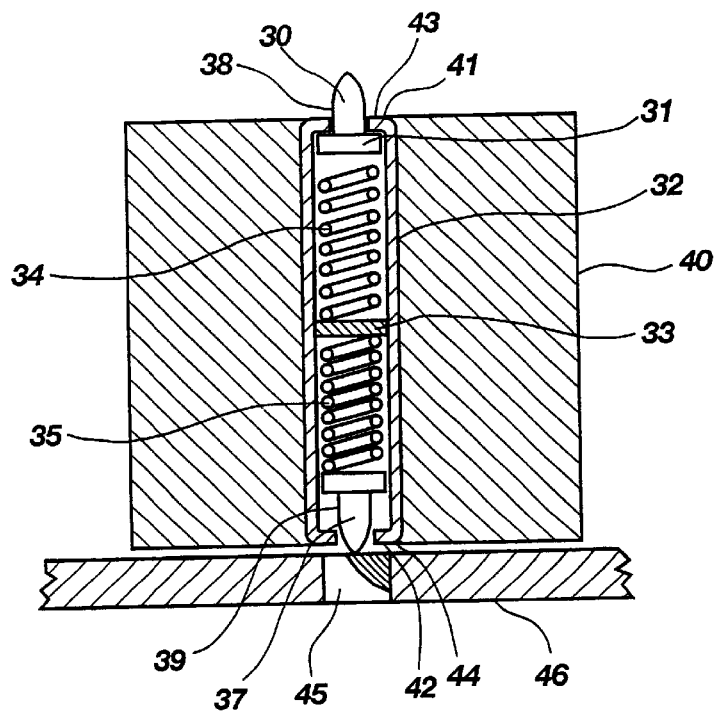
FIG. 5 is a cross-sectional view of the test probe within a socket, engaged with a DUT board.

Illustrated in drawing FIG. 5 is the test probe within a socket 40 with the barrel 32 fit with zero clearance between the upper and lower outer surfaces of the sockets 41, 42 and the upper and lower inside surfaces of the barrels 43, 44 to transmit forces on the isolating feature 33 through the barrel 32 to the socket 40. Alternately, the force may be transmitted from the barrel 43, 44 to the socket 41, 42 through press fitting the barrel into the socket, adhesively, attaching the barrel to the socket, etc. The lower probe 39 has been depressed, and lower tip 37 maintains a constant force on a contact pad 45 of the DUT board 46. Lower spring 35 is under compression and continuously bears on isolating feature 33. Upper probe 38 is in the unengaged position. The socket may be formed from any suitable plastic material, if desired.

Figure 6:
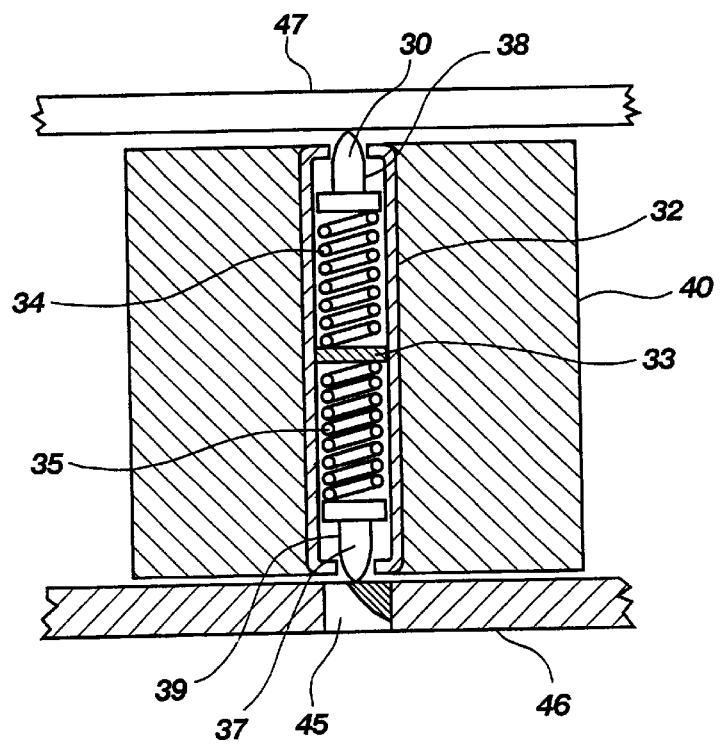
FIG. 6 is a cross-sectional view of the test probe within a socket, engaged with a DUT board and a DUT.
Figure 1:
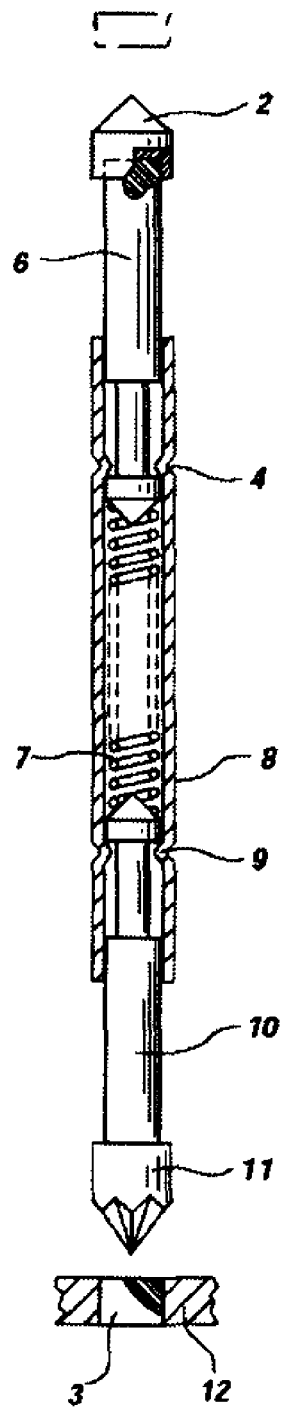
Figure 2:
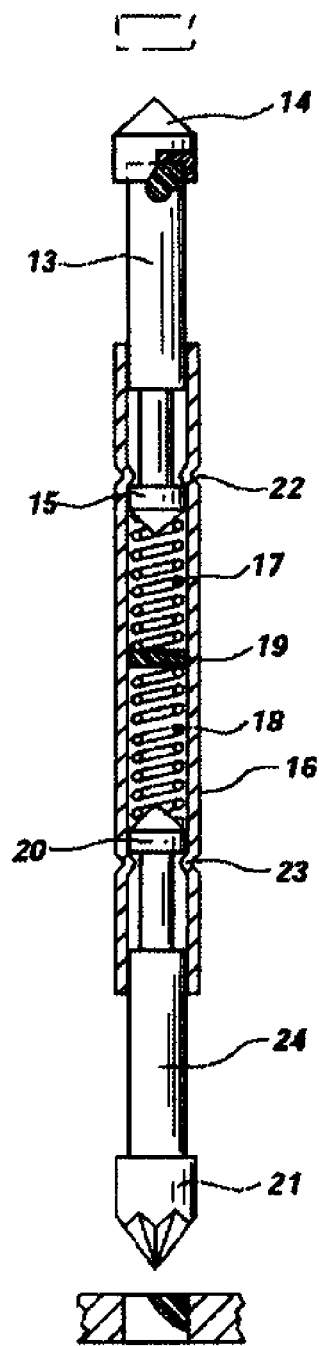
Figure 3:
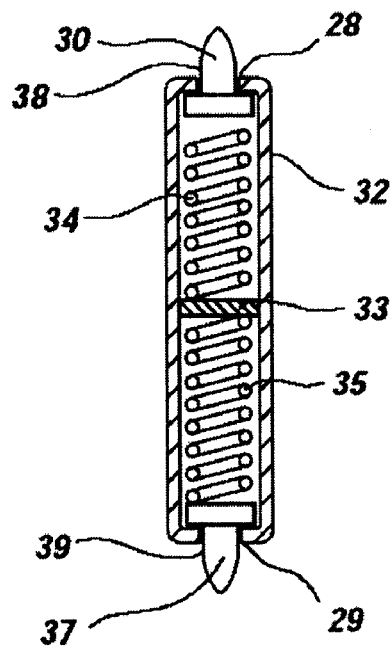
Figure 5:
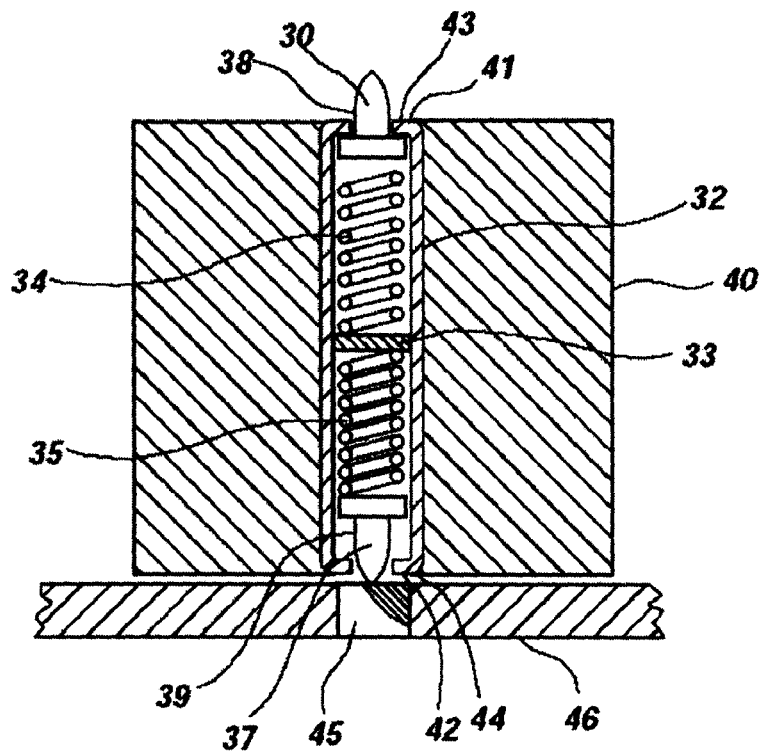

Depicted in drawing FIG. 6 is the test probe within a socket 40, with the upper probe 38 engaged with DUT 47 and lower probe 39 engaged with DUT board 46. Both upper and lower springs 34, 35 are under compression, and the force is transferred through the isolating feature 33 to the barrel 32. The barrel 32 is constrained by the socket 40. The contact between the lower tip 37 and the contact pad 45 on the DUT board 46 is not affected by the forces between the upper tip 30 and DUT 47.

Although the foregoing description contains many specifics, these should not be construed as limiting the scope of the present invention, but merely as providing illustrations of some of the preferred and exemplary embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

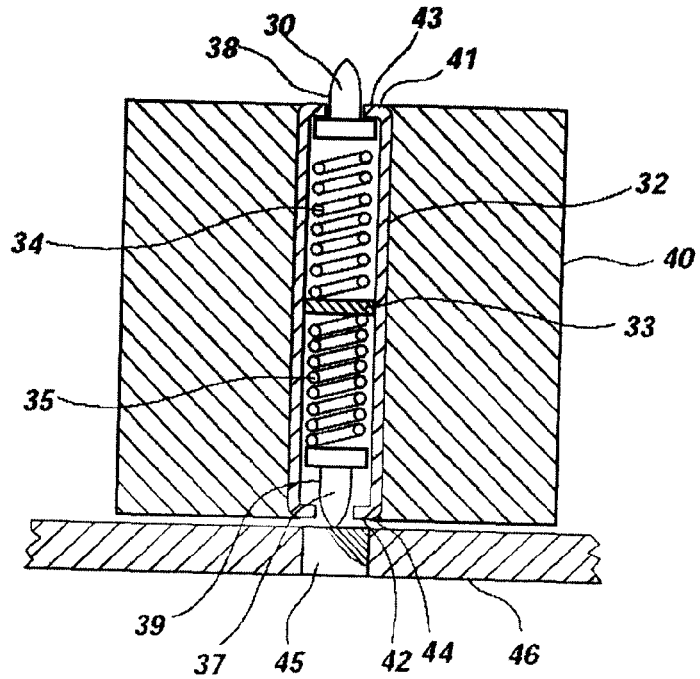

What is claimed is:

1. A test probe contactor for testing an electrical device, comprising:
    at least one socket securely attached about an elongated housing, said housing comprising top and bottom opposite open ends and an isolating feature, an uppermost portion and a lowermost portion of said housing being disposed against said socket such that there is substantially zero clearance between said uppermost and lowermost portions and said at least one socket;
    a top probe partially positioned within said housing, said top probe slidable within said housing along its longitudinal axis and terminating in a probe tip;
    a bottom probe partially positioned within said housing, said bottom probe slidable within said housing along its longitudinal axis and terminating in a probe tip;
    a top compression spring positioned within said housing engaging and axially biasing said top probe outward from said housing, said top compression spring braced continuously against said isolating feature; and
    a bottom compression spring positioned within said housing engaging and axially biasing said bottom probe outward from said housing, said bottom compression spring braced continuously against said isolating feature.

2. The test probe contactor of claim 1, wherein said electrical device to be tested includes one of a pin grid array, ball grid array, dynamic random access memory, or thin small outline package.

3. The test probe contactor of claim 1, wherein said at least one socket includes a socket of a plastic material.

4. The test probe contactor of claim 1, wherein said housing, top and bottom probes, and top and bottom compression springs include an electrically conductive material.

5. The test probe contactor of claim 1, wherein said probe tips include a tip formed of nickel with a gold coating.

6. The test probe contactor of claim 1, wherein said probe tips include one of a pointed tip, a rounded tip, and a multifaceted tip.

7. The test probe contactor of claim 1, wherein said housing includes an apparatus for limiting an outwardly directed axial displacement of said top and bottom probes, said apparatus comprising reduced apertures located in said housing at said open ends or at points axially inward from said open ends.

8. The test probe contactor of claim 1, wherein said at least one socket includes a removable socket.

9. A test probe for contacting an electrical device to be tested, said test probe comprising:
    an elongated housing comprising an open top end, an opposite open bottom end, an upper stop and a lower stop, said stops spaced axially from said top end and bottom end respectively, and an isolating feature;
    a top probe partially positioned within said housing, said top probe slidable within said housing along its longitudinal axis and terminating in a probe tip;
    a bottom probe partially positioned within said housing, said bottom probe slidable within said housing along its longitudinal axis and terminating in a probe tip;
    a top compression spring positioned within said housing engaging and axially biasing said top probe outward from said housing, said top compression spring braced continuously against said isolating feature; and
    a bottom compression spring positioned within said housing engaging and axially biasing said bottom probe outward from said housing, said bottom compression spring braced continuously against said isolating feature.

10. The test probe of claim 9, wherein said electrical device to be tested includes one of a pin grid array, ball grid array, dynamic random access memory, and thin small outline package.

11. The test probe of claim 9, wherein said housing, top and bottom probes, and top and bottom compression springs comprise an electrically conductive material.

12. The test probe of claim 9, wherein said probe tips include a tip of nickel having a gold coating.

13. The test probe of claim 9, wherein said probe tips include one of a pointed, tip, a rounded tip, and a multifaceted tip.

14. A process of making an electrical connection between an electrical device and a device under test (DUT) board, comprising:
    providing at least one socket securely attached about an elongated housing, said housing comprising top and bottom opposite open ends, upper and lower stops, said stops spaced axially from said top end and bottom end respectively, and an isolating feature;
    a top probe partially positioned within said housing, said top probe slidable within said housing along its longitudinal axis and terminating in a probe tip;
    a bottom probe partially positioned within said housing, said bottom probe slidable within said housing along its longitudinal axis and terminating in a probe tip;
    a top compression spring positioned within said housing engaging and axially biasing said top probe outward from said housing, said top compression spring braced continuously against said isolating feature;

a bottom compression spring positioned within said housing engaging and axially biasing said bottom probe outward from said housing, said bottom compression spring braced continuously against said isolating feature;

engaging said bottom probe with said DUT board and compressing said top compression spring against said isolating feature; and engaging said top probe with said electrical device and compressing said bottom compression spring against said isolating feature.

15. The process of claim 14, wherein engaging said top probe with said electrical device comprises pulling said electrical device to said top probe using one of a vacuum, a pneumatic force, and mechanical actuating apparatus.

16. The process of claim 14, wherein said electrical device includes one of a pin grid array, ball grid array, dynamic random access memory, and thin small outline package.

17. A test probe for contacting an electrical device to be tested, said test probe comprising:

an elongated housing comprising an open top end, an opposite open bottom end, substantially flat, annular stops at said top and bottom ends, and an isolating feature;

a top probe partially positioned within said housing, said top probe slidable within said housing along its longitudinal axis and terminating in a probe tip;

a bottom probe partially positioned within said housing, said bottom probe slidable within said housing along its longitudinal axis and terminating in a probe tip;

a top compression spring positioned within said housing engaging and axially biasing said top probe outward from said housing, said top compression spring braced continuously against said isolating feature; and a bottom compression spring positioned within said housing engaging and axially biasing said bottom probe outward from said housing, said bottom compression spring braced continuously against said isolating feature.

18. The test probe of claim 17, wherein said electrical device to be tested includes one of a pin grid array, ball grid array, dynamic random access memory, and thin small outline package.

19. The test probe of claim 17, wherein said housing, top and bottom probes, and top and bottom compression springs comprise an electrically conductive material.

20. The test probe of claim 17, wherein said probe tips include a tip of nickel having a gold coating.

21. The test probe of claim 17, wherein said probe tips include one of a pointed, tip, a rounded tip, and a multifaceted tip.

* * * * *

UNITED STATES PATENT AND TRADEMARK OFFICE
CERTIFICATE OF CORRECTION

PATENT NO.     : 6,677,772 B1
DATED          : January 13, 2004
INVENTOR(S)    : James A. Faull It is certified that error appears in the above-identified patent and that said Letters Patent is hereby corrected as shown below:

Delete Title page and insert attached title page.

Delete drawings consisting of figures 1,2,3 and 5 and replace with the attached figures.

Column 4,
Line 50, after "pointed" delete the comma ",".

Column 6,
Line 27, after "pointed" delete the comma ",".

Signed and Sealed this

Twentieth Day of December, 2005

JON W. DUDAS
*Director of the United States Patent and Trademark Office*

(12) United States Patent
Faull

(10) Patent No.: US 6,677,772 B1
(45) Date of Patent: Jan. 13, 2004

(54) CONTACTOR WITH ISOLATED SPRING TIPS

(75) Inventor: James A. Faull, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/226,066

(22) Filed: Aug. 21, 2002

(51) Int. Cl.$^7$ ............................................. G01R 31/02
(52) U.S. Cl. ....................................................... 324/761
(58) Field of Search ................................. 324/761, 754, 324/765, 158.1, 758, 72.5, 757; 439/482, 700, 824, 877

(56) References Cited

U.S. PATENT DOCUMENTS

| | | |
|---|---|---|
| 4,918,384 A | 4/1990 | Giringer et al. |
| 5,227,718 A | 7/1993 | Stowers et al. |
| 5,420,519 A | 5/1995 | Stowers et al. |
| 5,451,883 A | 9/1995 | Staab |
| 5,576,631 A | 11/1996 | Stowers et al. |
| 5,688,127 A | 11/1997 | Staab et al. |
| 5,703,494 A * | 12/1997 | Sano ........................... 324/761 |
| 5,781,023 A | 7/1998 | Swart et al. |
| 5,936,421 A | 8/1999 | Stowers et al. |
| 6,034,532 A | 3/2000 | Tarzwell |
| 6,222,377 B1 | 4/2001 | Kato |
| 6,225,817 B1 | 5/2001 | Sayre et al. |

* cited by examiner

Primary Examiner—Kamand Cuneo
Assistant Examiner—Jimmy Nguyen
(74) Attorney, Agent, or Firm—TraskBritt

(57) ABSTRACT

The spring-loaded contact probe electrically connects a semiconductor device, such as a device under test (DUT) with a substrate, such as a DUT board to be coupled with testing equipment. The probe comprises a barrel, two probes slidable within the barrel, and two isolated springs for loading the probes. The two isolated springs allow the probes to be engaged without affecting the connection of the opposite probe. The barrel housing the probes is securely attached within a socket. An array of these sockets may be used as a connector device between the DUT and DUT board.

21 Claims, 4 Drawing Sheets